US010535292B2

(12) United States Patent
Pirtskhlava et al.

(10) Patent No.: US 10,535,292 B2
(45) Date of Patent: Jan. 14, 2020

(54) ONE WAY DISPLAY

(71) Applicants: Nato Pirtskhlava, Tbilisi (GE); Gocha Janelidze, Tbilisi (GE)

(72) Inventors: Nato Pirtskhlava, Tbilisi (GE); Gocha Janelidze, Tbilisi (GE)

(73) Assignee: Nato Pirtskhlava, Tbilisi (GE)

( * ) Notice: Subject to any disclaimer, the term of this patent is extended or adjusted under 35 U.S.C. 154(b) by 0 days.

(21) Appl. No.: 15/814,705

(22) Filed: Nov. 16, 2017

(65) Prior Publication Data

US 2018/0137796 A1  May 17, 2018

Related U.S. Application Data

(63) Continuation-in-part of application No. 14/306,575, filed on Jun. 17, 2014, now abandoned.

(51) Int. Cl.
*G09G 3/20* (2006.01)
*H01L 51/52* (2006.01)
(Continued)

(52) U.S. Cl.
CPC ............ *G09G 3/2003* (2013.01); *G09F 9/33* (2013.01); *H01L 51/5281* (2013.01);
(Continued)

(58) Field of Classification Search
CPC ............... G09G 3/2003; G09G 3/3208; G09G 2300/023; G09G 2300/0452;
(Continued)

(56) References Cited

U.S. PATENT DOCUMENTS 5,751,385 A    5/1998   Heinze
6,345,328 B1   2/2002   Rozario et al.
(Continued)

FOREIGN PATENT DOCUMENTS

CN       1591107 A    3/2005
CN    101248477 A    8/2008
(Continued)

OTHER PUBLICATIONS

International Search Report for International Application No. PCT/IB2015/055102 dated Feb. 12, 2016.
(Continued)

*Primary Examiner* — Tony O Davis
(74) *Attorney, Agent, or Firm* — Dorsey & Whitney LLP

(57) ABSTRACT

A one way display and a method for driving the display pixels are provided, wherein the display comprises a front surface for displaying images and a back surface designed for providing see-through capabilities; at least two layers made of a transparent material; a plurality of light emitting elements sandwiched between said layers of a transparent material and mounted across the area of the display in groups, each group of light emitting elements making up a colored pixel of the display, and each pixel consisting of at least three adjacent or stacked red, green and blue light emitting elements; a plurality of narrow-band filters arranged in groups, each group consisting of at least three red, green and blue narrow-band filters mounted in parallel to the light emitting elements to block the lights in the narrow-band ranges of red, green and blue respectively towards the back surface of the display.

17 Claims, 3 Drawing Sheets

(51) Int. Cl.
 *G09F 9/33* (2006.01)
 *G02B 5/20* (2006.01)

(52) U.S. Cl.
 CPC ......... *G02B 5/201* (2013.01); *G09G 2300/02* (2013.01); *G09G 2300/0452* (2013.01); *G09G 2310/027* (2013.01); *G09G 2340/0407* (2013.01)

(58) Field of Classification Search
 CPC ..... G09G 2340/0407; G09G 2310/027; G09G 2300/02; H01L 51/5281; G09F 9/33; G02B 5/201
 USPC .......................................................... 345/212
 See application file for complete search history.

(56) References Cited

U.S. PATENT DOCUMENTS

| | | | |
|---|---|---|---|
| 7,133,093 | B2 | 11/2006 | Ochiai et al. |
| 7,513,674 | B1 | 4/2009 | Donahue |
| 7,854,513 | B2 | 12/2010 | Quach |
| 8,136,278 | B2 | 3/2012 | Hill et al. |
| 9,207,485 | B2 | 12/2015 | Kashima et al. |
| 2002/0050784 | A1* | 5/2002 | Maeda ............... G09F 9/372 313/495 |
| 2002/0186214 | A1 | 12/2002 | Siwinski |
| 2004/0251821 | A1 | 12/2004 | Cok |
| 2004/0263066 | A1 | 12/2004 | Abe et al. |
| 2005/0105303 | A1 | 5/2005 | Emde |
| 2005/0263775 | A1 | 12/2005 | Ikeda et al. |
| 2006/0231842 | A1 | 10/2006 | Hirakata et al. |
| 2007/0009222 | A1 | 1/2007 | Koo et al. |
| 2007/0247439 | A1 | 10/2007 | Daniel et al. |
| 2009/0027630 | A1 | 1/2009 | Quach et al. |
| 2009/0147185 | A1 | 6/2009 | Quach |
| 2010/0228089 | A1 | 9/2010 | Hoffman et al. |
| 2011/0310121 | A1 | 12/2011 | Baron |
| 2013/0265349 | A1 | 10/2013 | Chan |
| 2013/0285537 | A1 | 10/2013 | Chaji |
| 2013/0341659 | A1 | 12/2013 | Lin et al. |
| 2014/0139458 | A1 | 5/2014 | Premutico et al. |
| 2014/0145161 | A1 | 5/2014 | Naijo |
| 2014/0146394 | A1 | 5/2014 | Tout et al. |
| 2014/0192078 | A1 | 7/2014 | Gilbert |
| 2014/0195454 | A1 | 7/2014 | Richie et al. |
| 2015/0042883 | A1 | 2/2015 | McRae |
| 2016/0240118 | A1* | 8/2016 | Ray .................. G02B 27/225 |
| 2016/0343984 | A1* | 11/2016 | Zeng ..................... H01L 51/56 |

FOREIGN PATENT DOCUMENTS

| | | |
|---|---|---|
| CN | 101390013 A | 3/2009 |
| CN | 102749750 A | 10/2012 |
| CN | 104637414 A | 5/2015 |
| DE | 20220828 | 4/2004 |
| EA | 004517 | 4/2004 |
| JP | 2006302626 A | 11/2006 |

OTHER PUBLICATIONS

U.S. Appl. No. 14/306,575, Sep. 21, 2016, Office Action.
U.S. Appl. No. 14/306,575, Jun. 2, 2017, Office Action.

* cited by examiner variation of pixel size and shape on the same panel

Narrow-band filters

ONE WAY DISPLAY

FIELD OF INVENTION

The present invention relates to transparent displays, and specifically to displays with an image that is visible from one side of the display only.

BACKGROUND OF THE ART

Provision of signage, specifically advertisements on large areas, such as building facades, is a common business for a long time. Most of the display devices that are designed for those purposes are nowadays electronically controllable to be easily updatable. This is particularly important when information to be provided is related to the road direction or other massages and other advertisements.

The electronically controlled optical displays are based on two types of display techniques referred to as "passive" wherein one external light source is required to change an optical property of the display device, and as "active" that ensures an optical display device to be self-luminous.

Known examples of active optical displays are matrix arrays of light-emitting diodes (LEDs) that comprise discrete dots (so-called "pixels") being individually electronically controlled in their brightness and colors.

One known example of an active optical display system is that described in the patent document EA004517 (B1), which comprises light-emitting elements; electrodes; contact pads and light-emitting element control unit; at least one glass-packet with light-emitting elements inside; wherein the control unit consists of the inward glass-packet light-emitting element control part, placed inside that glass-packet, and the part to control the information display system in general, based outside the glass-packet. The information display system characterized in that the glass-packet at the same time is a part of building glazing and/or is architecture or construction element; light-emitting diodes, incandescent lamps and/or other light emitters are used for light-emitting elements; it has plain, bent and/or tubular shape; the glass-packet surface is covered with clarifying, lightsharing, heatreflecting and/or solarblocking coating; the light-emitting elements inside the glass-packet are fixed to the glass directly, or with lattice, strings, rods or similar construction elements, which provide regular arrangement; light-emitting elements, for instance light-emitting diodes, are placed in a way to provide two way directional information flow without transparent surfaces functionality failures; and it is operated in static and/or dynamic mode of displaying.

Such active optical display devices are not transparent when they are in off state and therefore they block the light passage completely, or at least partially.

The optical display devices having such features are limited in their application range particularly in building facades including windows, since they can deteriorate the normal function of a window by worsening the daylight intake as well as view through the window at night.

In an attempt to eliminate the above mentioned drawback of self-luminous display devises many different solutions have been proposed, such as for example disclosed in German patent application DE 2002220828 (2002 October), which comprises at least one optically transparent layer and light emitting elements with respective leads for individually controlling the elements. To ensure the see-through capabilities of a windowpane the leads are made as small as possible—not greater than 0.1 mm, especially not greater than 0.05 mm.

However, when the display is switched on at night, the information through it can be visible not only outside of a building but to the people inside the room where the display is used as a windowpane. This is not always desirable, particularly in office rooms wherein the people are performing their daily tasks and the information displayed through room windows, particularly the dynamically changing images, may disrupt the office workers normal operation.

Even at daytime, when the display is turned off the windowpane still remains not completely transparent since number of such leads is very high and the thin lines of opaque leads are still visible that may not be desirable in aesthetic point of view.

The above example shows that it would be desirable to have high transparency and one-way through vision capability so that an active display could have extensive application.

In order to enhance the transparency of the active display devices, a certain type of light emitting elements, so called OLEDs, i.e. Organic Light Emitting Diodes, such as described in U.S. Pat. No. 6,345,328, are used nowadays. The thin organic layers contained in OLEDs are particularly transparent in off state.

However OLED material, i.e. a thin organic layer, appears colored to the human eye when it is off state.

SUMMARY OF THE INVENTION

It is an object of the present invention to provide an active see-through display device that is suitable for integrating into at least part of a building facade and that produces a rapid succession of images that are perfectly visible from outside of a building while they do not obstruct the building occupants.

In one aspect, the present invention comprises light emitting elements, such as for example Organic Light Emitting Diodes (OLEDs) that are sandwiched between sheets of transparent material, such as for example glass, forming the display panel, and a control means for selectively energizing the OLED's so as to produce succession of images to be displayed, the OLEDs being spaced from one another at a distance sufficient for ensuring required density of images to be displayed from outside of a building, i.e. from relatively long distance, afar the building, and at the same time, sufficient for allowing the building occupants to view through the panel without any obstruction.

The one way display in accordance with the present invention comprises a front surface and a back surface, the front surface being designed for displaying images to a display observer who is viewing the display from the front surface, and the back surface being designed for providing see-through capabilities to a display observer who is viewing the display from the back surface; at least two layers made of a transparent material; a plurality of light emitting elements sandwiched between said layers of a transparent material and mounted across the area of the display in groups, each group of light emitting elements making up a colored pixel of the display, and each pixel consisting of at least three adjacent or stacked red, green and blue light emitting elements so as to provide required color of the pixel by combination of the red, green and blue lights emitted from the light emitting elements; a plurality of narrow-band filters arranged in groups, each group consisting of at least three red, green and blue narrow-band filters mounted in parallel to said red, green and blue light emitting elements making up the display pixels to block the lights in the narrow-band ranges of red, green and blue respectively towards the back surface of the display.

In one aspect, the display is provided with a plurality of additional light emitting elements mounted across the area of the display in groups in parallel to said narrow-band filters, each group of the additional light emitting elements making up a colored pixel of the display, and each pixel consisting of at least three adjacent or stacked red, green and blue light emitting elements so as to provide required color of the pixel by combination of the red, green and blue lights and to neutralize the colors of lights getting through said narrow-band filters towards the display back side.

In its preferred embodiment, the present invention comprises a set of transparent OLEDs, i.e. a type of OLEDs that have only transparent components—substrate, cathode and anode, and are up to 85% as transparent as their substrates. Thus when a transparent OLED display panel is turned on, it allows light to pass in both directions.

The OLED electrodes may comprise for example conductive glasses such as ITO.

The present invention and its aspects can be explained in more detail based on the following detailed description in conjunction with the appended drawings, wherein.

Figure 1:
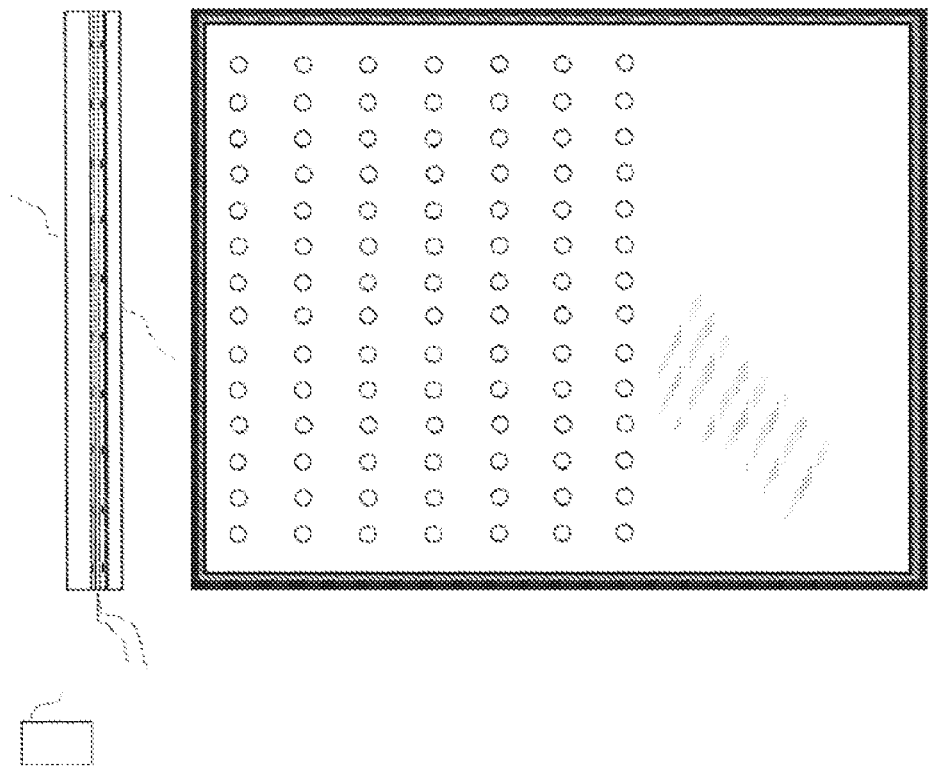
FIG. 1 depicts the display panel according to the present invention which comprises light emitting elements sandwiched between transparent layers.
Figure 2:
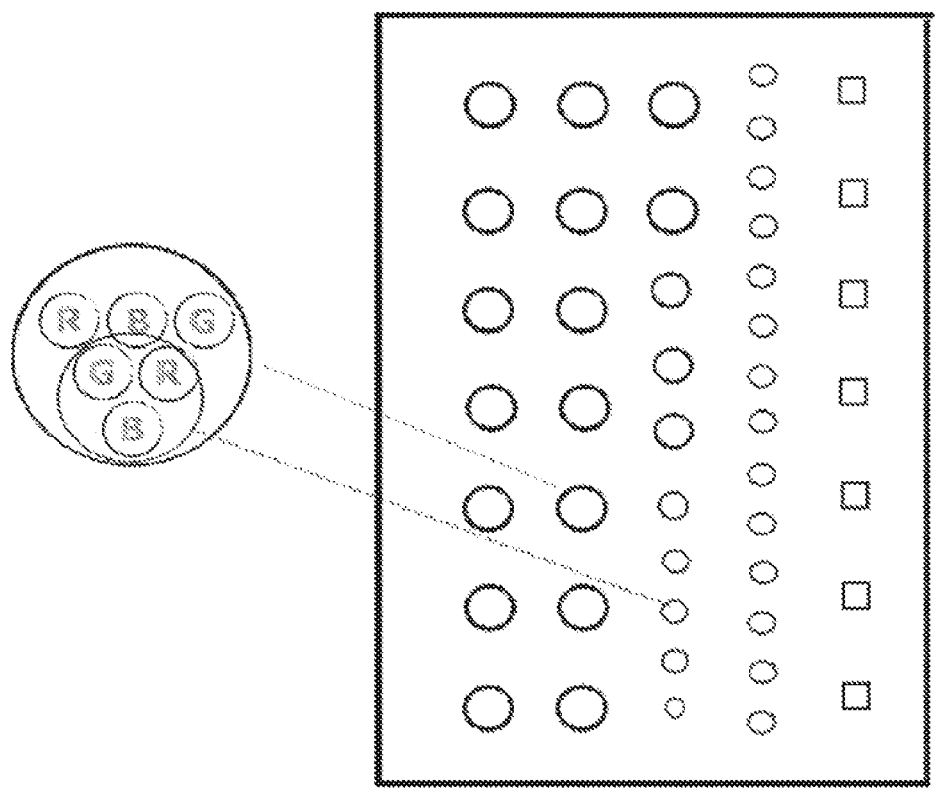
FIG. 2 depicts arrangement of pixels and subpixels of various shape across the display panel according to the present invention.
Figure 3:
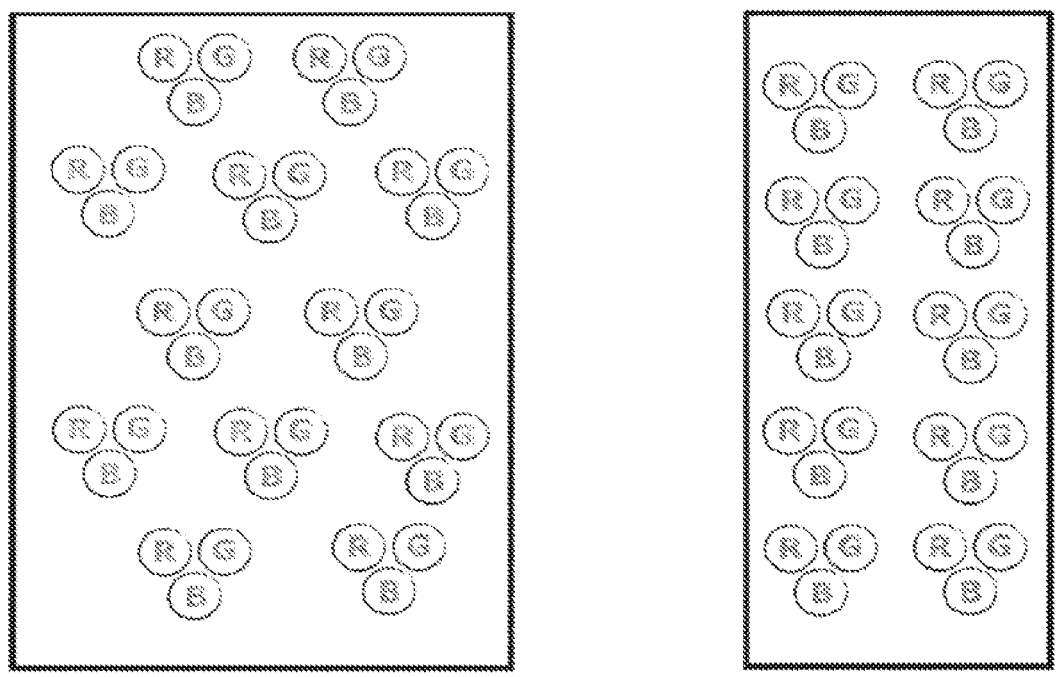
FIG. 3 depicts narrow-band filters arranged in parallel with light emitting elements according to the present invention.
Figure 3:
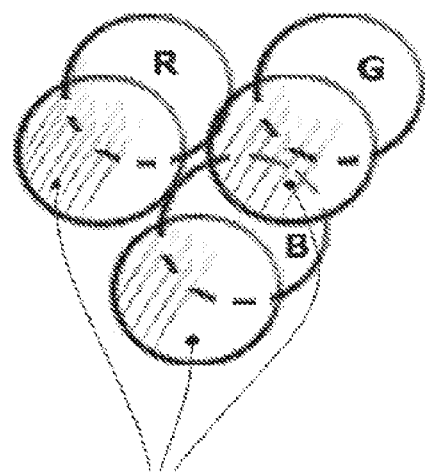

The concept of the present invention is to provide a see-through display panel with dot-matrix data, which allows obtaining as fine images as possible through a large screen dot-matrix display. These types of displays use large display surfaces with affordable image resolution.

It is well established fact that density of a bit-mapped dot-matrix image can be as low as possible when viewed from afar. On the other hand, when viewed from near distance, for example from inside of a room, the low density dot-matrix image may seem to a viewer practically transparent.

Thus to achieve the objective of the present invention, i.e. to obtain the see-through capabilities of display panels, it has to be defined a reasonable density which would allow a building occupant to see through the transparent display panel without obstruction on the one hand, and on the other hand, affordable quality of displayed images when viewed from afar, i.e. from outside of a building, on the other hand.

Calculation of distance between the pixels or the light emitting elements, which make up a display panel, i.e. pixel pitch, is well known to a person skilled in this art. Optimum pixel pitch and size may differ depending on viewing distance and displayed sign. For example, typical pixel pitch for outdoor use can be as high as from 20 to 30 mm, which can produce images of affordable definition. These values are quite affordable to enable a display panel to be as transparent as possible and not to obstruct a viewer using it indoors.

The present invention provides for reproducing colored images as well. This can be accomplished by bringing 3 light emitting elements, such as OLEDs, of e.g. red, green and blue color in one pixel. This will enable color consistency across the viewing surface, irrespective of sign size.

While the above described approach of increasing the pixel pitch allows obtaining reasonable transparency of display panel while maintaining affordable definition of images reproduced by the display panel, it may still happen that building occupants will suffer from viewing rapidly changing lighted dots during the operation of colored emitting OLEDs. To eliminate this inconvenience, the present invention in its further aspect employs transparent color filters disposed in front of/behind each pixel across the display panel. The suitable color filters must be narrow-band so as to remove the wavelengths of particular color in the narrow band range and turn the respective OLED behind the filter invisible to a viewer. So the lighted color elements will only be visible from outside of a building. The color filters suitable for these purposes can be those operating by reflection, absorption or other filtering principles. It may seem advantageous to use a kind of optical filters such as thin-film polarizes as well, for example those for red, blue and green colors based on interference effect; though the polarizers based on absorptive effect may also be applicable.

In order for the display panel according to the present invention to be fully compatible with various viewing conditions, in particular, viewing distance, the present invention contemplates to provide the possibility of varying the display resolution.

This may be accomplished by adjusting the number of pixels to be activated for reconstruction of the display images. For example, when relatively high resolution is required, which means that the display must be watched from relatively shorter distance, the circuitry that controls the reproduction of the display images can be set in a manner as to involve all of the pixels provided across the display panel so as to reproduce a higher definition images. And vice versa, when the display panel has to be viewed from relatively longer distance, the control circuitry can be set in a manner as to shift the display definition, i.e. to omit one or more pixels between each two pixels in the matrix array that are active in order to reproduce image sequence.

Various algorithms for enabling the pixel number shifting functions for these purposes can be employed, that would be obvious for those skilled in the art.

One of the aspects of the present invention contemplates adjusting the pixel sizes and shapes on the same area.

A single pixel on a display is made as a rule of several pixel components, so called subpixels. When the sizes of pixels need to be adjusted in order to suit the adjusted display definition as described above, the pixel driving circuitry can be set in a manner as to activate/deactivate some pixel components, i.e. subpixels, in each activated pixel across the display panel so as to render particular pixels, larger or smaller.

The pixel size varying function in this way can be bound with the reproducible pixel number adjustment function which has been described in previous paragraphs of this description.

In the practical application of the present invention it is important to provide the possibility of adjusting the brightness of the active light emitting elements throughout the display panel. This is particularly important when OLED elements are to be used across the display panel that reproduces colored images. As is known pixels in this case are made up of separate red, green and blue elements, and as has been observed, drop in brightness of blue OLEDs which causes color balance issues as OLED displays age. The technique to combat this issue is to drive the blue OLEDs at a higher brightness, or to make blue pixels larger to enable them appear brighter. Another reason for that is the need in reproducing as high quality images as possible adapted to operation under daytime or nighttime conditions, which can be accomplished, together with other known techniques by adjusting the luminance of pixels, particularly in a high resolution image.

This can obviously be accomplished either manually or automatically by, for example, varying frequency of a pulsative driving voltage for each OLED element.

Automatic brightness control can include an optical feedback in which a photocell monitors OLED brightness and varies the applied voltage to obtain a predetermined brightness. The frequency of the excitation voltage and make appropriate adjustments to the brightness. The varying of the pulse rate to the red, green, and blue substrates varies their respective brightness, and varies the resultant color emitted by the OLED. The predetermined pattern of varying pulse rates can be programmed to produce any number of desired shifts over time in the resultant color.

It may sometimes seem to be reasonable to provide means that ensure enhanced life cycle of a display panel, particularly of a large size one comprising numerous dot-matrix light emitting elements. A well known technique for addressing this issue envisions use of redundant light emitting elements, such as extra OLED elements arranged in the form of an additional backup layer.

Whatever resolution of a display is utilized, or whatever is the size of a pixel in the display panel it may still be viewable, for a human from some viewing distances, the pixels that are active during the operation of a display.

In order to address this issue, OLED displays, particularly dot-matrix displays, utilize the light shielding spots above the pixels so as to block the light beams emitting from the active light elements in one direction. This will enable those inside a building to view the light shields which can be of various colors, preferably white, instead of viewing the rapidly changing of light emitted from the active pixel element. In this respect, the present invention contemplates also a different approach that would enable a viewer to notice nothing but transparent pixels while they are in operation. This approach is based on characteristics of the human visual system.

In particular, to block the light emitted from the back side of the OLED element comprised in each pixel element and, thereby, render it invisible to the human eye, the display panel can be provided with plurality of narrow-band filters disposed at the back side of each OLED element. Thus arranged narrow-band filters behind primary color red, blue and green pixel elements (OLEDs) enable to block the red light emitted from the rapidly excited red OLED element, the blue light emitted from the rapidly excited blue OLED element, and the green light emitted from the rapidly excited green OLED element.

While the narrow-band filters allow the red, blue and green lights to be blocked from emitting toward the rear side of a display pane from respective (red, blue and green) OLED elements of the display panel, the same filters allow the rest spectral components of the light outside the filter narrow-band range to pass through them. That is to say, the narrow-band filter behind the red OLED element, while it blocks the emitted red light from the OLED element, allow the light in the spectral range that is outside the filter narrow-band red light range to pass through it. This means that the incoming light from outside the building where the display pane is installed that has wide range of spectral components at a daytime, including blue and green light, will pass the filter with the red light being substracted and will be viewed from inside the building as cyan (or as teal, depending on the light intensity incoming from outside the building). Likewise, the narrow-band filter behind the green OLED element, while it blocks the emitted green light from the OLED element, allow the light in the spectral range that is outside the filter narrow-band green light range to pass through it. This means that the incoming light from outside the building where the display pane is installed that has wide range of spectral components at a daytime, including blue and red light, will pass the filter with the green light being substracted and will be viewed from inside the building as magenta (or as purple, depending on the light intensity incoming from outside the building). Again, the narrow-band filter behind the blue OLED element, while it blocks the emitted blue light from the OLED element, allow the light in the spectral range that is outside the filter narrow-band blue light range to pass through it. This means that the incoming light from outside the building where the display pane is installed that has wide range of spectral components at a daytime, including green and red light, will pass the filter with the blue light being substracted and will be viewed from inside the building as yellow (or as olive, depending on the light intensity incoming from outside the building).

As a result, the human observer inside the building will perceive the mix of three colors, namely cyan (or teal), magenta (or purple) and yellow (or olive), passing through the red, blue and green narrow-band filters during a daytime, the mix being rendered white when they are encompassed within the spatial integration zones of the human visual system making the individual primary color elements individually unresolvable by the observer's eye.

Thus the human observer will see the incoming light from outside the building as white light during a daytime while the rapidly excited OLED elements emitting the primary color lights remain invisible. In this fashion, the realistic see-through display pane is assumed that acts as an ordinary transparent window pane lacking any blinking OLED elements within its structure.

The narrow-band filter elements that can be employed in the one way display panel described above can be liquid crystal cells in combination with stacked along with wavelength selective dichroic polarizers to selectively substract varying amount of incident light energy from within one of three primary color bands. In a preferred embodiment, color notch polarizers can be utilized in the stacked structure. Adjacent to the liquid crystal, circular polarizers for red, blue or green lights can be disposed along with quarter wave retarder plates that convert the linearly polarized light (red, blue and green) back to circularly polarized light. Thus the linearly polarized light exiting the liquid crystal enters the retarder plate. The circularly polarized light exiting the opposite side retarder is either passed or extinguished depending the direction of polarization (right handed or left handed). The notch filters of this type are well known for those skilled in the art.

In practice, however, it may appear that not the full amount of incoming from outside light incident upon and transmitted through the stacked display OLED elements and respective narrow-band filters pass through these elements as they are not completely transparent. Thus the broad spectrum light passing through the red, blue and green narrow-band filters during a daytime may become e.g. teal, purple and olive, which correspond to decimal codes of (0,128,128), (128,0,128) and (128,128,0) respectively, instead of cyan, magenta and yellow which correspond to decimal codes of (0, 255,255), (255,0, 255) and (255,255,0) respectively. This may lead to certain imbalance of colors and color tints when viewed from inside the building.

Again, a single pixel on a color subpixelated display is made of several color elements such as red, green and blue elements which are stacked in colored sub-pixel OLEDs. According to the color physiology of the human eye, by adding three or more primary colors of light together, i.e. by mixing them, a wide variety of colors can be perceived. Mixing equal amounts of red, green and blue yield white light as an example. If additional pixels across the display panel are stacked on each OLED pixel across the display panel, it will be possible to drive them in the manner as to make the colors of the emitted light of OLEDs stacked below the additional pixel element invisible, and even to render the colored pixels transparent.

To achieve the above described object, an OLED display device of the present invention includes plural first electrodes each formed for each of unit pixels on a principal surface of an insulating substrate, plural first OLED layers that are stacked on each of the first electrodes and emit color light different from each other, and second electrode formed over the plural OLED layers, plural second OLED layers that are stacked on each of the plural first OLED layers that emit color light different from each other, and third electrode formed over the plural second OLED layers.

In this exemplary embodiment, the pixel transparency is achieved by driving the plural second OLED layers in a way as to compensate the color emitted from the plural first OLED layers by mixing it with different color so as to render the resulting emission white or nearly white.

To this end, the present invention contemplates the pixel driving method according to which the driving circuitry included in the display controller computes the magnitude of the signal needed for applying on the third electrode formed over the plural second OLED layers. As is well known, mixing equal amounts of red, green and blue yields white light. For this purposes, The microprocessor built in the driving circuitry by use of a special purpose color-to-white mapping algorithm computes in real time a signal magnitude appropriate for rendering the emitted light from the plural first OLED layers in conjunction with the plural second OLED layers white or nearly white when it is applied to the third electrode formed over the plural second OLED layers. In this manner, the pixel becomes transparent against the white background of the glass material used for forming the display panel. A very simple algorithm can be implemented without complex computations needed as can be understood by those skilled in the art.

However, all common silica glass has a slight green tinge. Ordinary glass appears colorless to the naked eye when it is thin, although iron oxide impurities produce a green tint. The color of glass depends on the impurities it contains. Consequently, the color-to-white mapping algorithm can be adjusted in a manner as to yield the color that matches the tint of the glass material used. Thus the display panel can become completely transparent without any noticeable pixel units for a human. In this case, one can still look out and see the colored objects on the other side of the display because the color light from outside still gets through the display panel without being blended with the colors emitted by the OLED layers.

It should be mentioned herein that the above described technique can be applicable in daylight conditions, when the color of a glass material is nearly white. Thus at evening time the color-to-white mapping algorithm may be shifted to the color-to-gray one as an example, or to the color-to-black one at night.

A light sensing means can be mounted aside the display that would provide a feedback loop to monitor the ambient lighting outdoors in order to adjust the color-to-white mapping algorithm automatically.

In order to eliminate the reflectance of light incident to the frontal surface of the display panel, the display can be provided with light guides, such as optical fibers, disposed on a pixel by pixel basis.

Distal ends of the optical fibers are arranged at frontal side of the display, i.e. abutted against the display surface. The optical fibers have proximal ends operatively connected to a light source, that is, light from such light source is transmitted from the proximal ends of the optical fibers to distal end portions so that they are visible on the display surface. As a result, the distal end portions of the optical fibers create points of changing color on the visible surface, each of the points corresponding to only a single one of the optical fibers though which the light has been transmitted. The result is a fiber-optic illuminated display with an image which appears to change color over time.

While the preferred embodiments of the present invention is described on the basis of OLED elements those skilled in the art could understand that the advantages of the present invention would be the case with some light emitting elements used other than OLEDs, particularly with LEDs, as it described in the patent document EA004517 (B1) which is referred to in the background portion of the present application and which is incorporated herein in its entirety.

It should be understood that the display panels in accordance with the present invention, either large or small size, used as window panes can be of any shape or design to suit to the building facade or interior wherein they might be installed. Moreover, the transparent layers of the display panels may be rippled or have other types of a texture to meet certain aesthetic requirements.

The panel may have more than two transparent or semi-transparent layers between which the light emitting elements can be arranged as is used in certain architectural or design solutions.

It should also be understood that the present invention can be accomplished in a variety of forms other than as flat window panes. By way of example, the display may have a tubular shape, instead of a flat one, or even a cubic shape that would be suitable for representing 3D images, and so forth, so as to find application not only on building facades, but as street advertisement billboards or as transparent information spaces for representing various aesthetic 3D images inside them.

The invention claimed is:

1. A one way display having a front surface and a back surface, the front surface being designed for displaying images to a display observer who is viewing the display from the front surface, and the back surface being designed for providing see-through capabilities to a display observer who is viewing the display from the back surface, the display comprising:
   at least two layers made of a transparent material;
   a plurality of primary light emitting elements sandwiched between said at least two layers made of said transparent material and mounted across an area of the display in groups;
   wherein each of the groups of light emitting elements makes up a colored pixel of the display;
   wherein each colored pixel consists of at least three adjacent or stacked red, green, and blue light emitting elements so as to provide a required color of the pixel by combination of the red, green and blue lights emitted from the light emitting elements;

a plurality of narrow-band filters arranged in groups, each group consisting of at least three red, green, and blue narrow-band filters mounted in parallel to said red, green and blue light emitting elements making up the display pixels to block the lights in the narrow-band ranges of red, green and blue respectively towards the back surface of the display.

2. The one way display of claim 1, wherein the light emitting elements include light emitting diodes (LEDs).

3. The one way display of claim 1, wherein the light emitting elements include organic light emitting diodes (OLEDs).

4. The one way display of claim 1, wherein said narrow-band filters include notch filters.

5. The one way display of claim 4, wherein said notch filters include color notch polarizers.

6. The one way display of claim 1, further comprising a plurality of additional light emitting elements mounted across the area of the display in groups in parallel to said narrow-band filters, each group of the additional light emitting elements making up a colored pixel of the display, and each pixel consisting of at least three adjacent or stacked red, green and blue light emitting elements so as to provide required color of the pixel by combination of the red, green and blue lights and to neutralize the colors of lights getting through said narrow-band filters towards the display back surface.

7. The one way display of claim 1, further comprising light guides including optical fibers disposed on a pixel by pixel basis, distal ends of the optical fibers being arranged such that they are abutted against the display front surface, and proximal ends of the optical fibers being operatively connected to the light emitting elements.

8. The one way display of claim 1, wherein said layers are of flat shape.

9. The one way display of claim 1, wherein said layers are of tubular shape.

10. The one way display of claim 1, wherein said layers are of cubic shape.

11. A method of driving a one way display pixel elements, the method comprising:

providing at least two layers made of a transparent material;

providing a plurality of primary light emitting elements sandwiched between said layers of a transparent material and mounted across the area of the display in groups, each group of light emitting elements making up a colored pixel of the display, and each pixel consisting of at least three adjacent or stacked red, green and blue light emitting elements so as to provide required color of the pixel by combination of the red, green and blue lights emitted from the light emitting elements;

providing a plurality of narrow-band filters arranged in groups, each group consisting of at least three red, green and blue narrow-band filters mounted in parallel to said red, green and blue light emitting elements making up the display pixels to block the lights in the narrow-band ranges of red, green and blue respectively towards the back surface of the display;

providing pixel driving circuitry for activating/deactivating the colored pixels to reproduce images to be displayed by the one way display; and adjusting the number of pixels to be activated for reconstruction of the display images by setting the pixel driving circuitry that controls the reproduction of the display images in a manner as to involve all of the pixels provided across the display area so as to reproduce a higher definition images, and by setting the pixel driving circuitry that controls the reproduction of the display images in a manner as to shift the display definition, i.e. to omit one or more pixels between each two pixels in array that are active so as to reproduce a lower definition images.

12. The method of claim 11, further comprising adjusting the pixel sizes and shapes by setting the pixel driving circuitry that controls the reproduction of the display images in a manner as to activate/deactivate some light emitting elements in each activated pixel across the display panel so as to render particular pixels, larger or smaller.

13. The method of claim 11, further comprising providing a plurality of additional light emitting elements mounted across the area of the display in groups in parallel to said narrow-band filters, each group of the additional light emitting elements making up a colored pixel of the display, and each pixel consisting of at least three adjacent or stacked red, green and blue light emitting elements so as to provide required color of the pixel by combination of the red, green and blue lights and to neutralize the colors of lights passing through said narrow-band filters towards the display back surface; computing by the pixel driving circuitry the magnitude of the signals and applying the signals on the electrodes of the additional light emitting elements for rendering the emitted light from the plural primary light emitting elements in conjunction with the plural additional light emitting elements white or nearly white at a daytime, or gray or nearly gray at an evening time.

14. The method of claim 11, wherein the light emitting elements include light emitting diodes (LEDs).

15. The method of claim 11, wherein the light emitting elements include organic light emitting diodes (OLEDs).

16. The method of claim 11, wherein said narrow-band filters include notch filters.

17. The method of claim 16, wherein the notch filters include color notch polarizers.

* * * * *